(12) United States Patent
Karouji et al.

(10) Patent No.: US 10,840,166 B2
(45) Date of Patent: Nov. 17, 2020

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Kumiko Karouji, Tokyo (JP); Morihiko Ikemizu, Kanagawa (JP); Yoshihisa Imori, Kanagawa (JP); Hiroaki Kishi, Kanagawa (JP); Tomohiko Imada, Kanagawa (JP); Akito Shimizu, Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/128,638

(22) Filed: Sep. 12, 2018

(65) Prior Publication Data

US 2019/0295923 A1 Sep. 26, 2019

(30) Foreign Application Priority Data

Mar. 20, 2018 (JP) .................. 2018-053249

(51) Int. Cl.
*H01L 23/373* (2006.01)
*H01L 23/495* (2006.01)
(Continued)

(52) U.S. Cl.
CPC ...... *H01L 23/3737* (2013.01); *H01L 23/3128* (2013.01); *H01L 23/49513* (2013.01); *H01L 23/49568* (2013.01); *H01L 23/49582* (2013.01); *H01L 23/49861* (2013.01); *H01L 24/29* (2013.01); *H01L 24/37* (2013.01); *H01L 24/73* (2013.01); *H01L 2224/2929* (2013.01); *H01L 2224/29347* (2013.01); *H01L 2224/32245* (2013.01); *H01L 2224/3729* (2013.01); *H01L 2224/37347* (2013.01);
(Continued)

(58) Field of Classification Search
CPC ............. H01L 23/3737; H01L 23/3128; H01L 23/49513; H01L 23/49568; H01L 23/49582; H01L 23/49861
See application file for complete search history.

(56) References Cited

U.S. PATENT DOCUMENTS

| | | | | |
|---|---|---|---|---|
| H001699 H | * | 12/1997 | Vavrick | B29C 65/344 156/276 |
| 6,107,216 A | * | 8/2000 | Kennedy | B32B 15/08 428/312.8 |

(Continued)

FOREIGN PATENT DOCUMENTS

| | | |
|---|---|---|
| JP | H11-350318 A | 12/1999 |
| JP | 2005-251771 A | 9/2005 |

(Continued)

*Primary Examiner* — Peniel M Gumedzoe
(74) *Attorney, Agent, or Firm* — White & Case LLP

(57) ABSTRACT

According to one embodiment, a semiconductor device includes a first semiconductor chip, a heat dissipation member provided on one surface of the first semiconductor chip and connected to the first semiconductor chip, and a sealing resin sealing the first semiconductor chip and the heat dissipation member. The heat dissipation member includes mutually interlaced metal fibers and a thermosetting resin.

8 Claims, 18 Drawing Sheets

(51) Int. Cl.
  *H01L 23/498* (2006.01)
  *H01L 23/31* (2006.01)
  *H01L 23/00* (2006.01)

(52) U.S. Cl.
  CPC ............... *H01L 2224/40175* (2013.01); *H01L 2224/48175* (2013.01); *H01L 2224/73221* (2013.01); *H01L 2224/73263* (2013.01); *H01L 2224/73265* (2013.01)

(56) References Cited

U.S. PATENT DOCUMENTS

| | | | | |
|---|---|---|---|---|
| 6,133,637 | A * | 10/2000 | Hikita | G01P 3/488 257/666 |
| 6,369,455 | B1 * | 4/2002 | Ho | H01L 23/3128 257/730 |
| 6,404,070 | B1 * | 6/2002 | Higashi | D03D 15/0088 257/778 |
| 8,674,520 | B2 | 3/2014 | Imaizumi et al. | |
| 2002/0117764 | A1 * | 8/2002 | Huang | H01L 23/4334 257/796 |
| 2006/0091527 | A1 * | 5/2006 | Tsai | H01L 23/3128 257/706 |
| 2006/0272150 | A1 * | 12/2006 | Eguchi | H05K 3/284 29/841 |
| 2007/0210438 | A1 * | 9/2007 | Briere | H01L 23/3107 257/690 |
| 2009/0115053 | A1 * | 5/2009 | Koduri | H01L 23/36 257/712 |
| 2015/0166771 | A1 * | 6/2015 | Aramaki | C08K 7/06 524/495 |

FOREIGN PATENT DOCUMENTS

| | | |
|---|---|---|
| JP | 2014-212182 A | 11/2014 |
| JP | 5919625 B2 | 5/2016 |

* cited by examiner

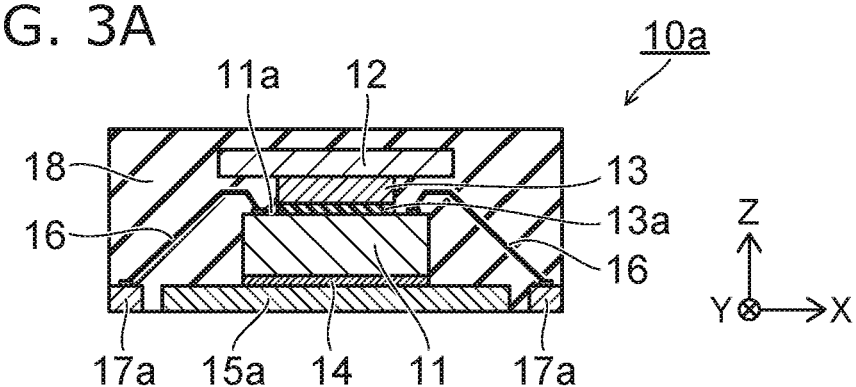
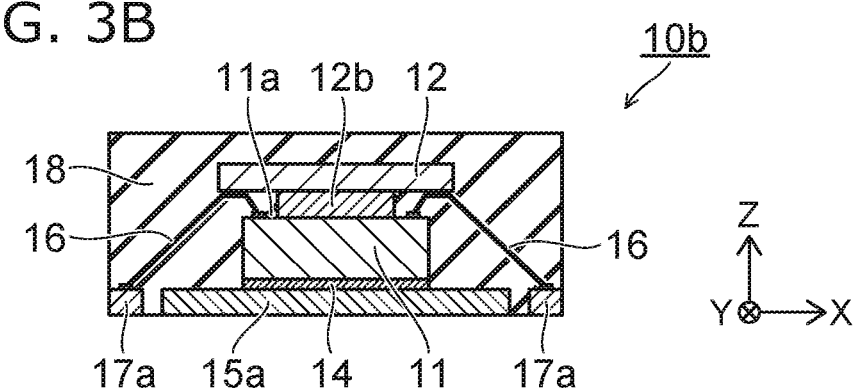
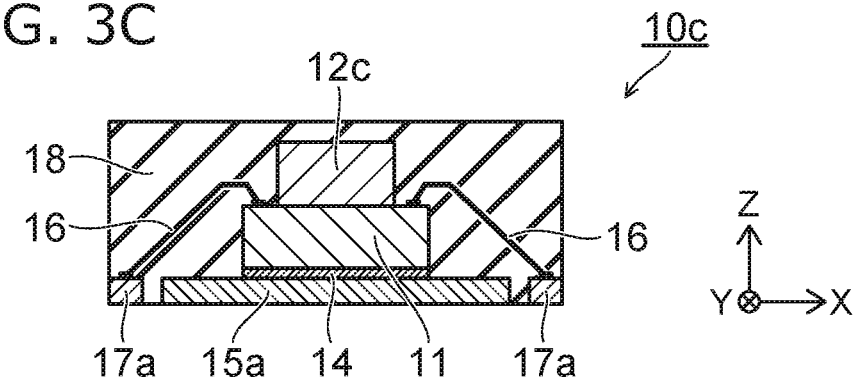

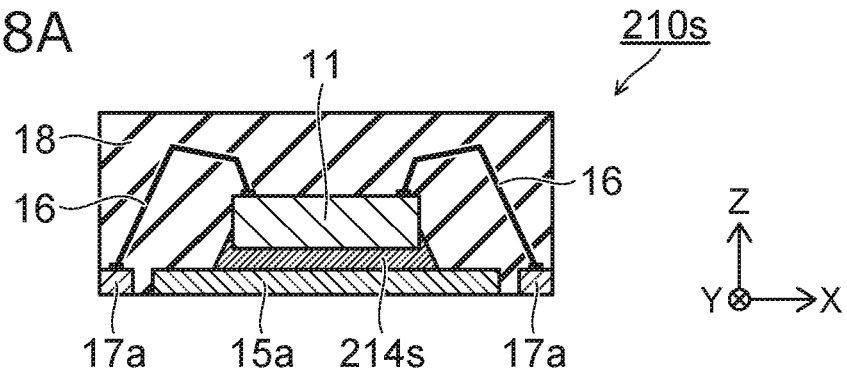
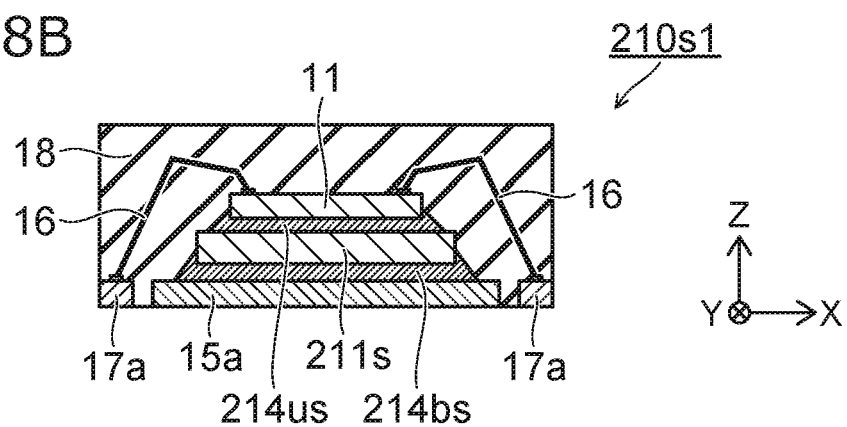
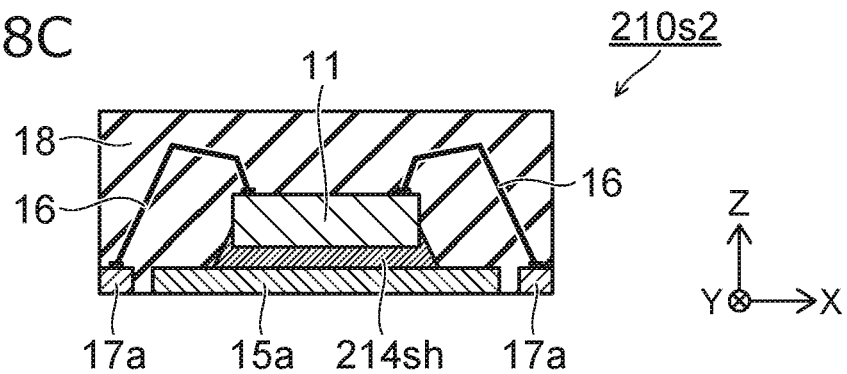
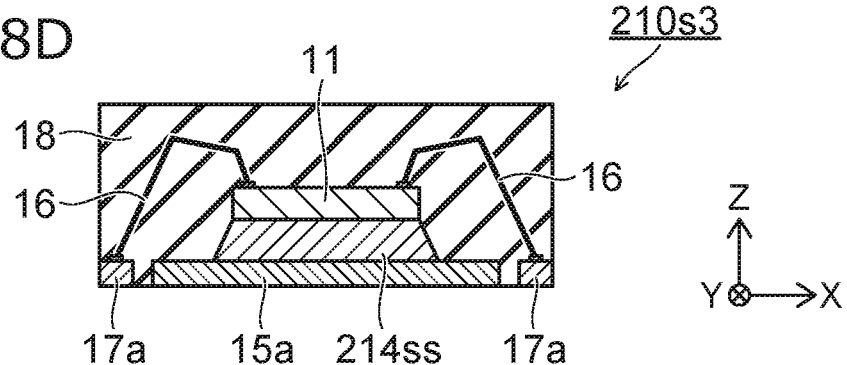

FIG. 15A
FIG. 15B
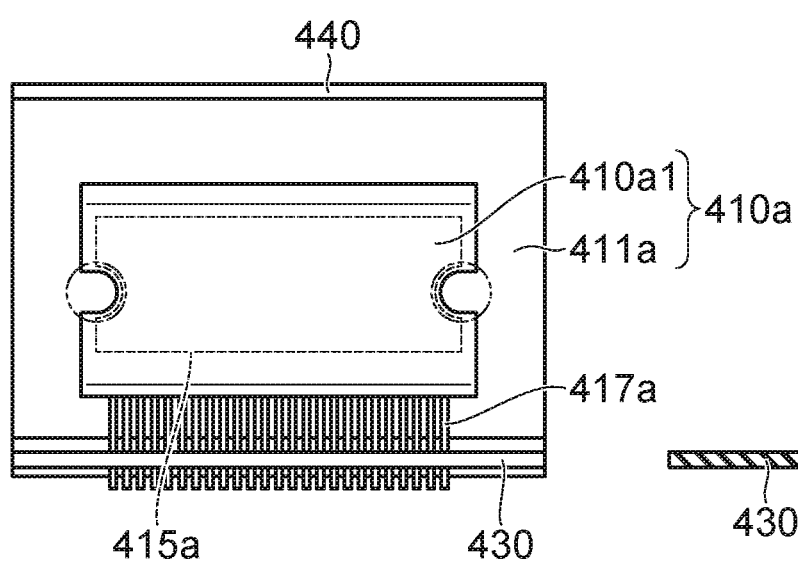
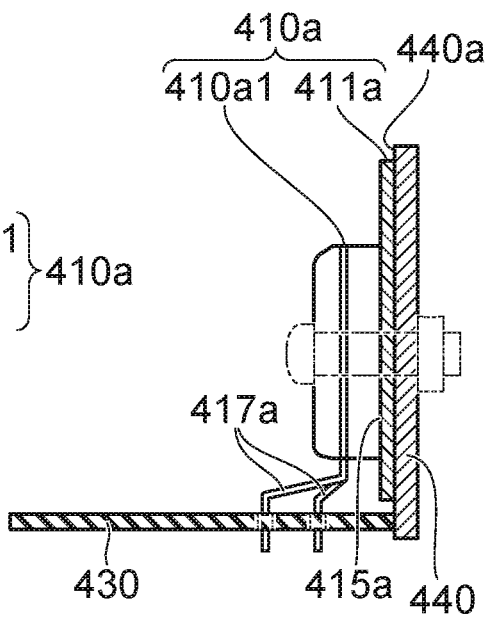

US 10,840,166 B2

SEMICONDUCTOR DEVICE

CROSS-REFERENCE TO RELATED APPLICATIONS

This application is based upon and claims the benefit of priority from Japanese Patent Application No. 2018-053249, filed on Mar. 20, 2018; the entire contents of which are incorporated herein by reference.

FIELD

Embodiments described later relate generally to a semiconductor device.

BACKGROUND

Function and performance of a semiconductor device is remarkably improved, and increases of the output current and the output voltage are progressed. Thus, thermal loss of the semiconductor device also tends to increase. In such a semiconductor device, it is necessary to improve the heat dissipation performance of the package.

BRIEF DESCRIPTION OF THE DRAWINGS

FIG. 3A to FIG. 3C are cross sectional views illustrating semiconductor device according to variations of the first embodiment at the position corresponding to AA line of FIG. 1A;

FIG. 8A to FIG. 8D are cross sectional views of semiconductor devices of comparative examples at the position corresponding to AA line of FIG. 1A;

FIG. 15 A is a front view illustrating a semiconductor device according to a variation of a fourth embodiment, FIG. 15B is a side view illustrating the semiconductor device according to the variation of the fourth embodiment;

DETAILED DESCRIPTION

Figure 1A:
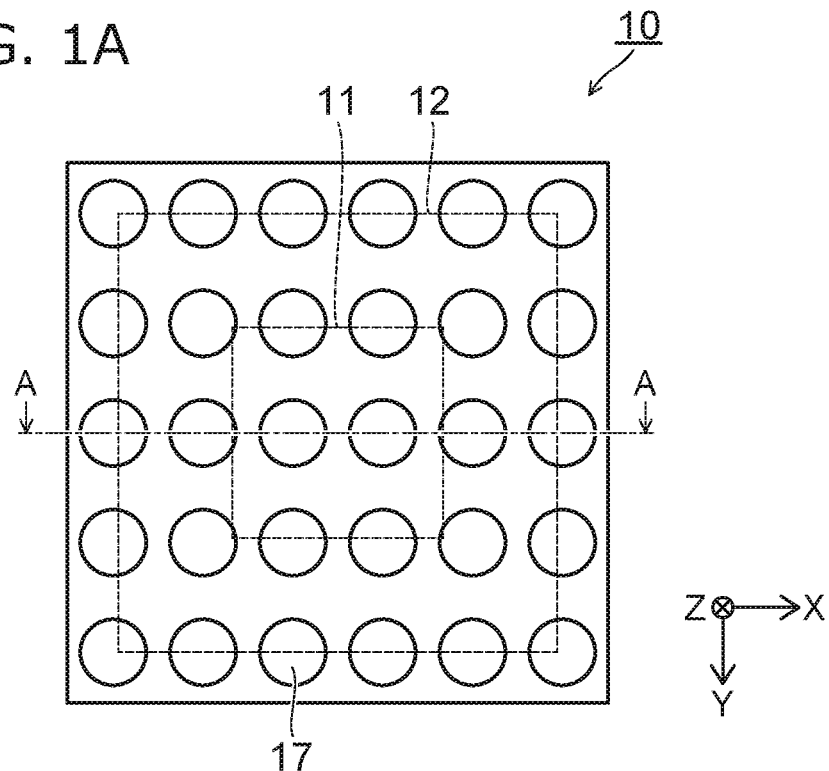
FIG. 1A is as bottom view illustrating a semiconductor device according to a first embodiment.

According to one embodiment, a semiconductor device includes a first semiconductor chip, a heat dissipation member provided on one surface of the first semiconductor chip and connected to the first semiconductor chip, and a sealing resin sealing the first semiconductor chip and the heat dissipation member. The heat dissipation member includes mutually interlaced metal fibers and a thermosetting resin.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
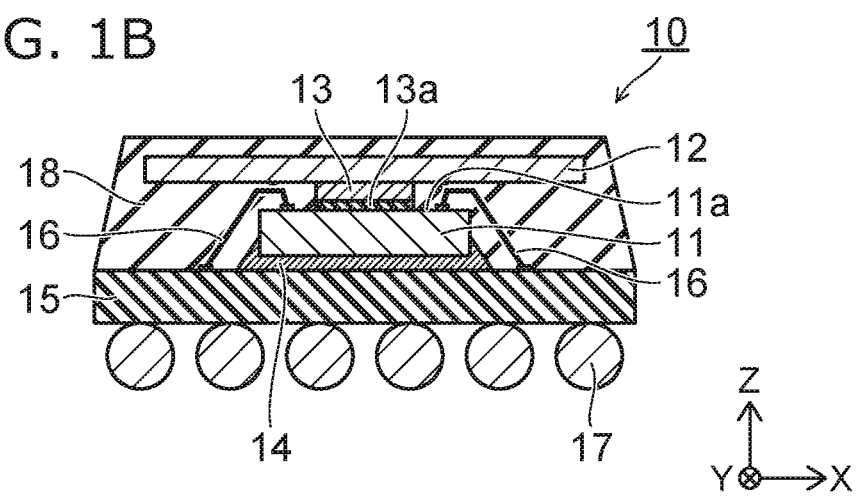
FIG. 1B is a cross section view at AA line of FIG. 1A.

FIG. 1A is a bottom view illustrating a semiconductor device according to an embodiment. FIG. 1B is a cross sectional view at AA line of FIG. 1A.

As shown in FIG. 1A and FIG. 1B, a semiconductor device 10 of the embodiment includes a semiconductor chip 11, a heat spreader 12, and a sealing resin 18. The semiconductor device 10 further includes a dummy chip 13, a joining member 14, a substrate 15, a bonding wire 16, and a connection terminal 17. The semiconductor device of this example is a BGA package (Ball Grid Array) with the heat spreader. The package with the spreader is applicable not only to the BGA but also to an LGA (Land Grid Array), an SOP (Small Outline Package), a QFP (Quad Flat Package), a QFN (Quad For Non-lead Package), a DFN (Dual For Non-lead Package) or the like.

In the following, a plane including an X-axis and a Y-axis perpendicular to the X-axis is assumed to be generally parallel to a first surface 11a of a semiconductor chip 11. A Z-axis is perpendicular to the X-axis and the Y-axis. For example, a positive direction of the Z-axis is upward in the figure in a cross section shown below.

The heat spreader (heat dissipation member) 12 is provided generally parallel to the first surface 11a via the dummy chip 13 on a side of the first surface 11a of the semiconductor chip 11. The first surface 11a is one surface of the semiconductor chip 11, and a surface where a connection pad connecting one end of a bonding wire 16 is provided.

The dummy chip 13 has no function, for example, is a chip formed of silicon (Si) or the like. The dummy chip 13 is provided parallel to the first surface 11a. In an X-Y plan view, an area of the dummy chip 13 is set smaller than an area of the semiconductor chip 11, and its perimeter is included in the perimeter of the first surface 11a. The connection pad of the semiconductor chip 11 is provided to surround the outside of outer perimeter of the dummy chip 13.

The dummy chip 13 is connected to the first surface 11a of the semiconductor chip 11 by using an adhesive member 13a. The dummy chip (spacer) 13 functions as a spacer when the bonding wire 16 connected to the first surface 11a is formed in a loop shape so as to be convex in the positive direction of the Z-axis. The dummy chip 13 is provided in order to take a distance between the semiconductor chip 11 and the heat spreader 12, and thus a loop portion of the bonding wire 16 does not contact the heat spreader 12.

A semiconductor chip having a different function from the semiconductor chip 11 may be provided between the semiconductor chip 11 and the heat spreader 12 in place of the dummy chip 13.

The heat spreader 12 is, for example, a generally square sheet member having an area not less than the area of the semiconductor chip 11. The area of the heat spreader 12 is larger than, for example, the area or the semiconductor chip 11 in the X-Y plan view, and the perimeter of the heat spreader 12 includes all the perimeter of the semiconductor chip 11.

The heat spreader 12 is made of a metal fiber sheet including a metal fiber including copper (Cu) or a Cu alloy and a thermosetting resin (hereinafter, referred to as simply metal fiber sheet). The metal fibers include mutually interlaced metal fibers having a high aspect ratio such as, for example, a fiber diameter of approximately 1 µm to 10 µm and a fiber length of approximately 1 mm to 10 mm. Mutually interlacing represents a state of metal fibers which get tangled one another. A content ratio of Cu in the metal fiber is favorably 100%, however the content of Cu may be less than 100%.

The thermosetting resin is impregnated into the metal fiber. The thermosetting resin is a resin which cures by heat, for example, a thermosetting adhesive, and is favorably conductive. The thermosetting adhesive can include a synthetic rubber and a natural rubber such as acrylonitrile-butadiene copolymer (NBR) or the like as a rubber component. An epoxy resin and a phenol resin or the like can be included. A cure temperature of the epoxy resin can be approximately 100° C. to approximately 160° C. Conductivity can be improved by using various metal powders or the like as conductive fillers.

The heat spreader 12 is the metal fiber sheet including the interlaced metal fibers impregnated thermosetting resin, and as described later, is formed by cutting the metal fiber sheet to a predetermined shape and size.

In this way, the heat spreader 12 includes the thermosetting resin. For that reason, the heat spreader 12 can be connected to the dummy chip 13 by heating after placing the heat spreader 12 on the dummy chip 13.

The semiconductor chip 11 is connected to the substrate 15 via the joining member 14. The joining member 14 is, for example, a silver (Ag) paste. A connection pad provided on the first surface 11a is electrically connected to the connection pad on the substrate 15 via the bonding wire 16. The connection pad on the substrate 15 is electrically connected to a connection terminal 17 by an interconnection provided on and inside the substrate 15. The connection terminal 17 is, for example, a solder ball.

The semiconductor device 10 is sealed by the sealing resin 18 in order to protect an internal structure including the semiconductor chip 11 from an external environment. In this example, the sealing resin 18 seals the whole except a side surface and a lower surface of the substrate 15, and the connection terminal 17.

Effects of the semiconductor device 10 of the embodiment will be described while comparing with a semiconductor device of a comparative example.

Figure 2:
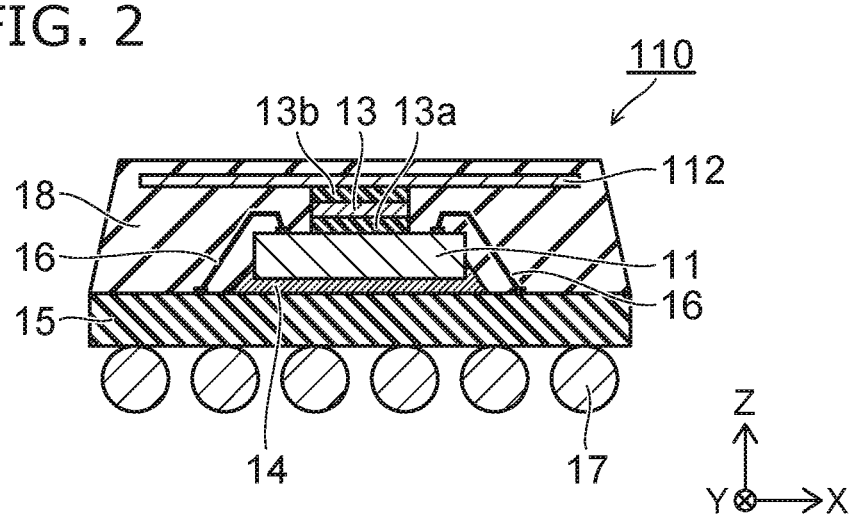
FIG. 2 is a bottom view of a semiconductor device of a comparative example at a position corresponding to AA line of FIG. 1A.

FIG. 2 is a cross section of a semiconductor device of a comparative example at a place corresponding to AA line of FIG. 1A.

As shown in FIG. 2, a semiconductor device 110 of the comparative example includes the semiconductor chip 11, a heat spreader 112, and the sealing resin 18. The heat spreader 112 is a sheet material made of Cu or a Cu alloy of bulk. In the case of the comparative example, the heat spreader 112 is connected onto the semiconductor chip 11 via the dummy chip 13. The heat spreader 112 is connected to the dummy chip 13 via an adhesive member 13b. The dummy chip 13 is connected to the semiconductor chip 11 via the adhesive member 13a. That is, both sides of the dummy chip 13 are necessary to be coated with the adhesive members 13a, 13b. For example, in the case where an adhesive tape is used for adhesion, the adhesive tape is affixed to the both sides of the dummy chip 13 in advance.

In the case of the comparative example, the heat spreader 112 is necessary to be sufficiently adhered to the sealing resin 18 when filling the sealing resin 18. For that reason, each side of the heat spreader 112 is, for example, necessary to be subjected to roughening treatment in advance.

On the contrary, in the semiconductor device 10 of the embodiment, since the heat spreader 112 includes the mutually interlaced metal fibers, the each side of the heat spreader 12 is substantially roughened by the mutually interlaced metal fibers. For that reason, the connection area with the sealing resin 18 increases and the adhesion is improved. Since peeling off of the heat spreader 12 from the sealing resin 18 is suppressed by a thermal stress in mounting the semiconductor device 10 on an apparatus or the like, reliability of environmental resistance can be improved.

Furthermore, in the semiconductor device 10 of the embodiment, since the connection surface of the heat spreader 12 and the sealing resin 18 is substantially roughened and the connection area with the sealing resin increases, a thermal resistance is reduced and the heat dissipation performance is improved.

In the semiconductor device 10 of the embodiment, since the heat spreader 12 includes the thermosetting resin, the heat spreader 12 can be connected to the dummy chip 13 by applying the heat treatment without providing the adhesive member separately. Therefore, it is possible to reduce the adhesive and the adhesive tape, and to reduce a portion of process of coating the adhesive on the both sides of the dummy chip 13.

(Variation)

Since the heat spreader can be of any shape and thickness, the heat spreader can be designed depending on necessary heat dissipation performance. Changing the configuration of the heat spreader makes it possible to further reduce the member.

FIG. 3A to FIG. 3C are cross sectional views illustrating the variation at the position corresponding to AA line of FIG. 1A.

The configuration of the above embodiment can also be applied to GFN, DFN, QFP, SOP or the like with the heat spreader. FIG. 3A to FIG. 3C are examples of applying to GFN (or DFN).

As shown in FIG. 3A, a semiconductor device 10a includes the semiconductor chip 11, and the heat spreader 12. The dummy chip 13 is provided between the semiconductor chip 11 and the heat spreader 12, and the semiconductor chip 11 and the dummy chip 13 are connected by the adhesive member 13a such as an adhesive tape or the like. The heat spreader 12 is connected to the dummy chip 13 by the thermosetting resin impregnated into the heat spreader 12. In this example, a side of the semiconductor chip 11 opposite to the first surface 11a is connected to a die pad 15a via, for example, the joining member 14 such as an Ag paste. An electrode pad on the semiconductor chip 11 is electrically connected to a connection terminal 17a of a flat lead via the bonding wire 16.

As shown in FIG. 3B, the dummy chip 13 may be replaced by a heat spreader 12b. That is, a semiconductor device 10b includes the semiconductor chip 11 and the heat spreaders 12, 12b. The heat spreader (heat dissipation member) 12b is provided between the semiconductor chip 11 and the heat spreader 12. The heat spreader 12b functions as a spacer which causes the bonding wire 16 not to contact the heat spreader 12 by taking a distance in the Z-axis direction between the semiconductor chip 11 and the heat spreader 12. Both of the heat spreaders 12, 12b are made of the metal fiber sheet. The metal fiber sheet includes the thermosetting resin. Therefore, the heat spreader 12b replaced from the dummy chip 13 can be connected to the first surface 11a of the semiconductor chip 11 by performing a heat treatment without using the adhesive tape or the like.

Since the heat spreader 12b includes the metal fiber such as Cu or the like, the thermal conductivity is high compared with the dummy chip 13 of silicon (Si) or the like, the thermal resistance from the semiconductor chip 11 to the heat spreader 12 is reduced, and the heat dissipation performance is further improved.

As shown in FIG. 3C, in a semiconductor device 10c, the dummy chip or the like is not provided and a heat spreader 12c is connected directly onto the semiconductor chip 11. The perimeter of a surface of the heat spreader (heat dissipation member) 12c parallel to the X-Y plane is set to be included in the perimeter of the first surface 11a of the semiconductor chip 11. More specifically, the perimeter of the heat spreader 12c is connected to the inside of the connection pad disposed on the first surface 11a. An area of the surface of the heat spreader 12c parallel to the X-Y plane is set to be smaller than the area of the semiconductor chip 11.

The thickness of the heat spreader made of the metal fiber sheet can be set arbitrarily. For that reason, like this variation, the thickness of the heat spreader 12c can be approximately total thickness of the heat spreader and the dummy chip of the above embodiment and the variation. Therefore, the heat spreader 12c can be avoided from contacting the bonding wire 16.

In this way, in the variation, the number of the components is possible to be reduced compared with the case of the comparative example. Like this variation, the thermal resistance of the heat spreader 12c can be reduced and the heat dissipation performance of the package can also be improved by increasing the thickness of the heat spreader 12c.

In the above, in connecting the semiconductor chip 11 to the die pad 15a, the joining member such as an Ag paste or the like may be replaced by the metal fiber sheet used for the heat spreader.

Second Embodiment

In the case of connecting the semiconductor chip to the die pad, the heat dissipation performance can be improved by using the metal fiber sheet impregnated with the thermosetting resin in place of using the joining member such as an Ag paste or the like between the semiconductor chip and the die pad.

Figure 4:
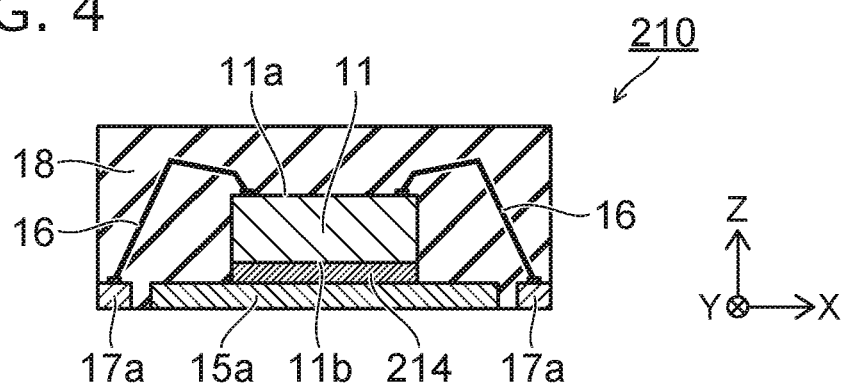
FIG. 4 is a cross sectional view illustrating a semiconductor device according to a second embodiment at the position corresponding to AA line of FIG. 1A.

FIG. 4 is a cross sectional view illustrating a semiconductor device according to the embodiment at the position corresponding to AA line of FIG. 1A.

As shown in FIG. 4, a semiconductor device 210 of the embodiment includes the semiconductor chip 11, a joining member 214, and the die pad 15a. The joining member 214 is provided between the semiconductor chip 11 and the die pad 15a. The semiconductor chip 11 is connected to the die pad 15a at a back side (second surface) 11b via the joining member 214.

The joining member (heat dissipation member) 214 includes the metal fiber sheet. Thermosetting resin is impregnated into the metal fiber sheet. The metal fiber sheet is configured as well as the heat spreaders of the above described other embodiments and the variations. That is, the metal fiber sheet includes the mutually interlaced metal fibers including Cu or a Cu alloy, and the thermosetting resin is impregnated.

Since the joining member 214 includes the metal fiber in the mutually interlaced state based on a high thermal conductivity metal material such as Cu or the like, the thermal conductivity is high and therefore the thermal resistance of the semiconductor device 210 can be small. Since the metal fiber does not include lead (Pb), the semiconductor device 210 can be a Pb free package. Since the thermosetting resin of the joining member 214 can be cured at a relatively low temperature, the thermal stress at manufacturing the semiconductor device 210 can be reduced, and the environmental resistance of the semiconductor device 210 can be improved.

FIG. 5A to FIG. 5E are cross sectional views illustrating a manufacturing process of the semiconductor device of FIG. 4.

Figure 5A:
FIG. 5A to FIG. 5E are cross sectional views showing an outline of a manufacturing flow of the semiconductor device of FIG. 4 at the position corresponding to AA line of FIG. 1A.

As shown in FIG. 5A, a lead frame 15LF is prepared. The lead frame 15LF includes a portion serving as the die pad 15a and a portion serving as the connection terminal 17.

Figure 5B:
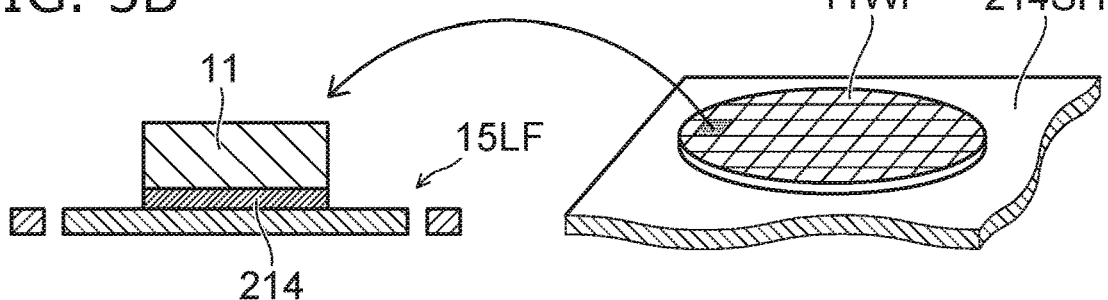

As shown in FIG. 5B, the semiconductor chip 11 and the joining member 214 are individualized from a semiconductor wafer 11WF affixed on a metal fiber sheet 214SH. For example, the semiconductor wafer 11WF is placed on the metal fiber sheet 214SH, and is heated from a side of the semiconductor wafer 11WF. This connects the metal fiber sheet 214SH to the semiconductor wafer 11WF. After that, the semiconductor chip 11 is cut and individualized in a state of the joining member 214 affixed to the back side.

The individualized semiconductor chip 11 and the joining member 24 are placed on a portion serving as the die pad of the lead frame 15LF.

For example, the thickness of the joining member 214 is set to be approximately 100 μm, however the thicknesses of the metal fiber sheet 214SH and the joining member 214 are not limited to this, and is set depending on the heat dissipation performance of the package.

Figure 5C:
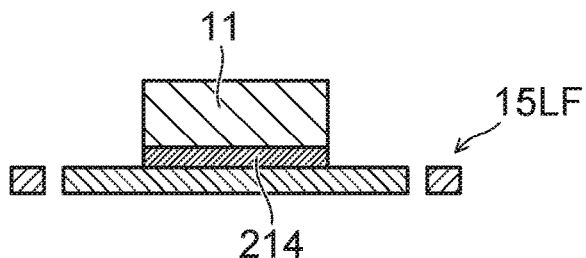

As shown in FIG. 5C, the thermosetting resin is heated to the curing temperature of the thermosetting resin from the lead frame 15LF side, and thus the semiconductor chip 11 is connected to the die pad portion of the lead frame 15LF.

Figure 5D:
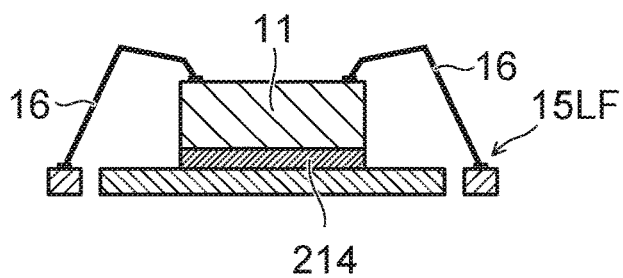

As shown in FIG. 5D, the connection pad of on the semiconductor chip 11 is connected to the portion serving as the connection terminal of the lead frame 15LF via the bonding wire 16.

Figure 5E:
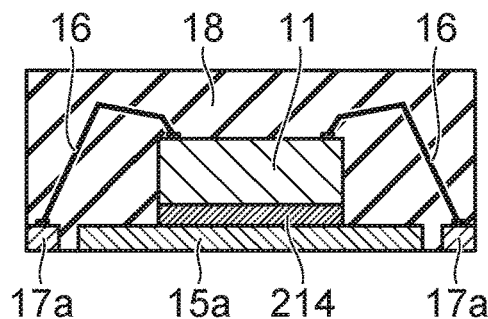

As shown in FIG. 5E, the sealing resin is filled by a transfer mold or the like, and the lead frame 15LF is cut.

Figure 6:
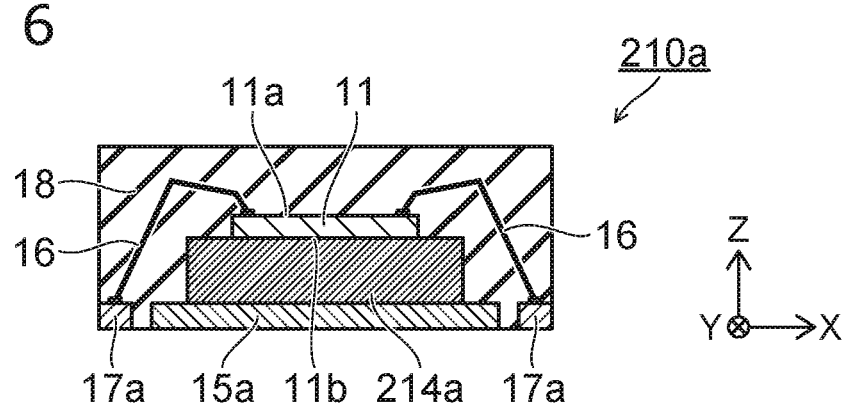
FIG. 6 is a cross sectional view illustrating a semiconductor device according to a variation of the second environment at the position corresponding to AA line of FIG. 1A.

FIG. 6 is a cross sectional view illustrating a semiconductor device according to the variation at the position corresponding to AA line of FIG. 1A.

As described in the case of the above described other embodiments, the thickness of the metal fiber sheet impregnated with the thermosetting resin can be set arbitrarily. In the second embodiment, the thermal resistance can be further reduced by thickening the thickness of the joining member formed by cutting the metal fiber sheet.

As shown in FIG. 6, a semiconductor device 210a includes a joining member 214a. The joining member (heat dissipation member) 214a is provided between the semiconductor chip 11 and the die pad 15a. The joining member 214a is cut from the metal fiber sheet having a sufficient thickness to be used. The thickness of the joining member 214a is thicker than the thickness of the semiconductor chip 11. A desired low thermal resistance (transient thermal resistance) can be realized by sufficiently increasing the thickness of the joining member 214a. For example, the thickness of the joining member 214a can be approximately 500 m.

An area of a surface parallel to the X-Y plane of the joining member 214a can also be set arbitrarily. In this example, the area of the joining member 214a is set to be larger than the area of the semiconductor chip 11. Therefore, the thermal resistance of the joining member 214a can be reduced, and the heat dissipation performance of the semiconductor device 210a can be further improved.

FIG. 7A to FIG. 7E are cross sectional views illustrating a manufacturing process of the semiconductor device of FIG. 6.

Figure 7A:
FIG. 7A to FIG. 7E are cross sectional views showing an outline of a manufacturing flow of the semiconductor device of FIG. 6 at the position corresponding to AA line of FIG. 1A.

As shown in FIG. 7A, the lead frame 15LF is prepared. This lead frame 15LF may be the same as the lead frame 15LF of the second embodiment.

Figure 7B:
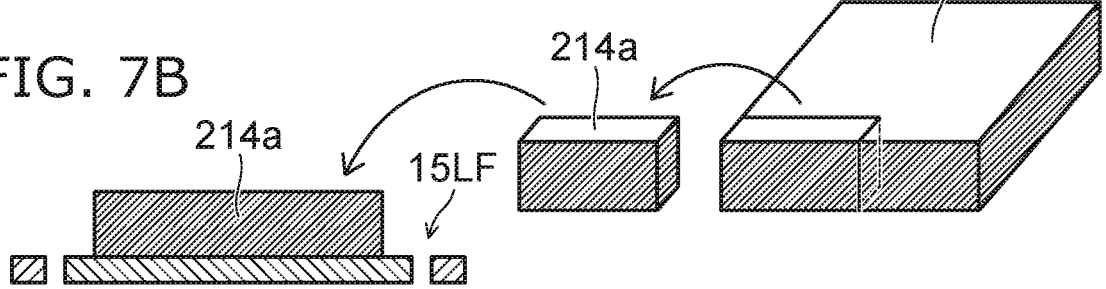

As shown in FIG. 7B, the cut joining member 214a is placed on a die pad portion of the lead framed 15LF. The joining member 214a and the lead frame 15LF temporarily connect by heating. The temporal connection is referred to as temporal fixing for connecting the joining member 214a and the lead frame 15LF after the next process.

Here, as shown in the right figure of FIG. 7B, the joining member 214a is cut into a predetermined shape from a metal fiber sheet 214aSH impregnated with the thermosetting resin. The metal fiber sheet 214aSH is set to have a thickness (500 μm) approximately 5 times the thickness in the second embodiment. The area parallel to the X-Y plane is set to be larger than the area of the semiconductor chip 11.

Figure 7C:
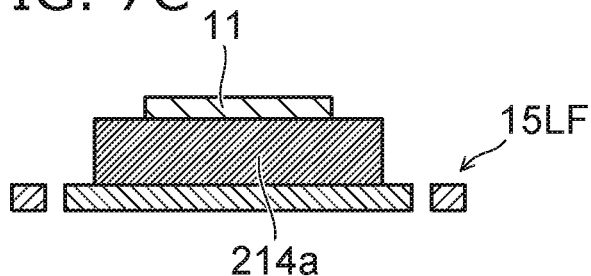

As shown in FIG. 7C, the semiconductor chip 11 is placed on the joining member 214a, and the semiconductor chip 11, the joining member 214a, and the lead frame 15LF are connected one another by heating.

Figure 7D:
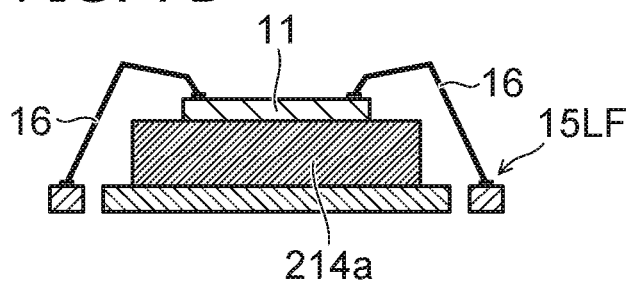

As shown in FIG. 7D, the semiconductor chip 11 and the connection terminal 17a are connected by the bonding wire 16.

Figure 7E:
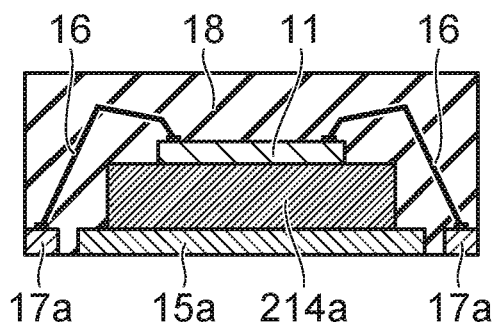

As shown in FIG. 7E, the resin is filled by the transfer mold or the like, and the lead frame 15LF is cut.

In this way, in the variation, the thermal resistance of the package can be easily reduced by appropriately setting the thickness and the area of the joining member 214a.

In this way, in the semiconductor devices 210, 210a of the embodiment and the variation, the number of main process can be five processes.

Effects of the semiconductor devices of the embodiment and the variation will be described while comparing with the semiconductor device of the comparative example.

FIG. 8A to FIG. 8D are cross sectional views of semiconductor devices of comparative examples at the position corresponding to AA line of FIG. 1A.

As shown in FIG. 8A, a semiconductor device 210s of the comparative example includes a joining member 21s between the semiconductor chip 11 and the die pad 15a. The joining member 214s is a generally used joining member, and is an Ag paste or the like. The Ag paste has low thermal conductivity and thus the thermal resistance of the semiconductor device 210s increases and the heat dissipation performance is low.

As shown in FIG. 8B, the semiconductor device 210s includes a metal plate 211s. The metal plate 211s having high thermal conductivity such as Cu or the like is provided between the semiconductor chip 11 and the die pad 15a. The metal plate 211s is connected to the semiconductor chip 11 via a joining member 214us, and connected to the die pad 15a via a joining member 214bs.

The metal plate 211s functions as a heat spreader. That is, the heat dissipation of the semiconductor device 210s1 is improved by adding the metal plate 211s having the low thermal resistance to a conduction path of the heat.

As shown in FIG. 8C, a semiconductor device 210s2 includes a joining member 214sh. In the joining member 214sh of this comparative example, the thermal resistance of the joining member 214sh is reduced by increasing a content of heat conduction particle in the joining member, for example, an Ag particle.

As shown in FIG. 8D, a semiconductor device 210s3 includes a joining member 214ss. The thermal conductivity of the joining member 214ss is improved and the thermal resistance is reduced by subjecting the heat conduction particle such as the Ag particle or the like to a sintering treatment (sintering).

A high temperature heat treatment is necessary for the joining members such as the joining member 214sh, 214ss having a high thermal conductivity in a connection processing with the semiconductor chip and the die pad.

FIG. 9A to FIG. 9G are cross sectional views showing an outline of a manufacturing process of the semiconductor device of FIG. 8B at the position corresponding to AA line of FIG. 1A.

Figure 9A:
FIG. 9A to FIG. 9G are cross sectional views showing an outline of a manufacturing flow of the semiconductor device of FIG. 8A at the position corresponding to AA line of FIG. 1A.
Figure 9B:
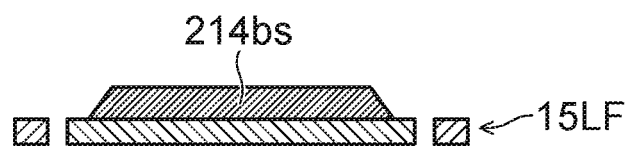

As shown in FIG. 9A, the lead frame 15LF is prepared, and as shown in FIG. 9B, the joining member 214bs is coated to the die pad portion of the lead frame 15LF.

Figure 9C:
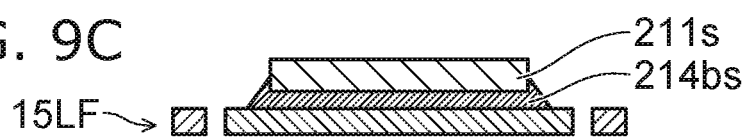
Figure 9D:
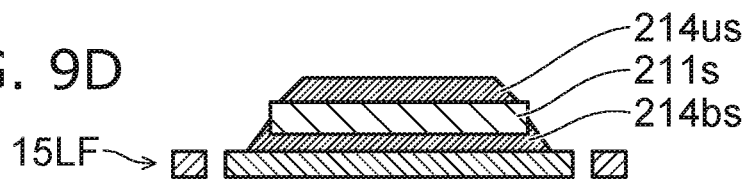

As shown in FIG. 9C, a metal plate 211s is placed on the joining member 214bs, and as shown in FIG. 9D, the joining member 214us is coated onto the metal plate 211s.

Figure 9E:
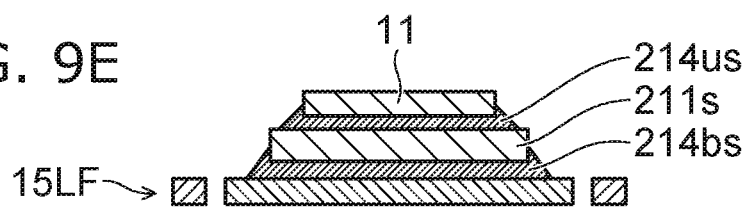

As shown in FIG. 9E, the semiconductor chip 11 is placed on the joining member 214us.

Figure 9F:
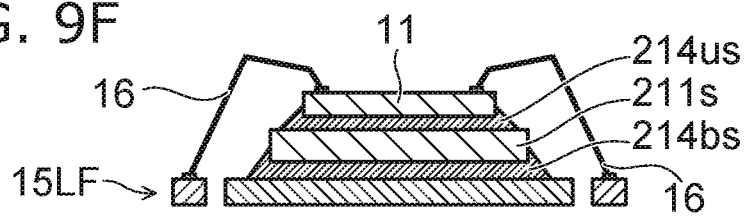

As shown in FIG. 9F, the semiconductor chip 11 and the portion serving as the connection terminal are connected by the bonding wire 16.

Figure 9G:
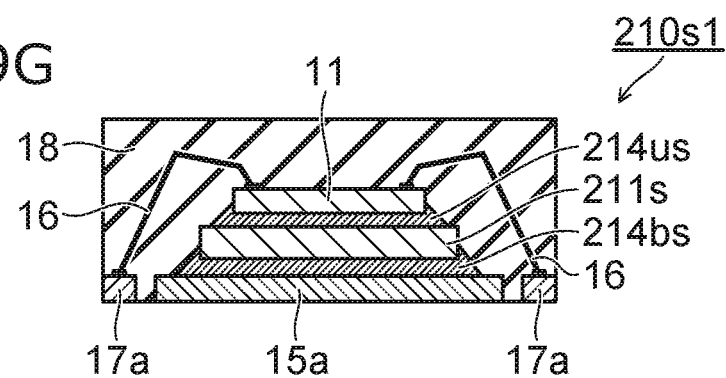

As shown in FIG. 9G, the resin is filled by the transfer mold or the like, and the lead frame 15LF is cut.

In this way, in the case of the package with the metal plate 211s for decreasing the thermal resistance, the number of processes increases by addition of the metal plate 211s, and the main processes are formed of seven processes.

FIG. 10A to FIG. 10F are cross sectional views showing a manufacturing flow of the semiconductor device of FIG. 8D at the position corresponding to AA line of FIG. 1A.

Figure 10A:
FIG. 10A to FIG. 10F are cross sectional views showing an outline of a manufacturing flow of the semiconductor device of FIG. 8D at the position corresponding to AA line of FIG. 1A.
Figure 10B:
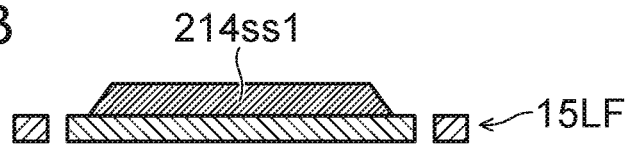

As shown in FIG. 10A, the lead frame 15LF is prepared, and as shown in FIG. 10B, a joining member 214ss1 is coated to the die pad portion of the lead frame 15LF.

Figure 10C:
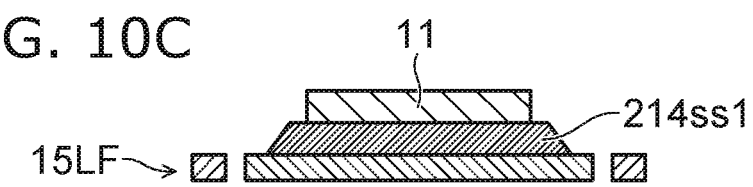
Figure 10D:
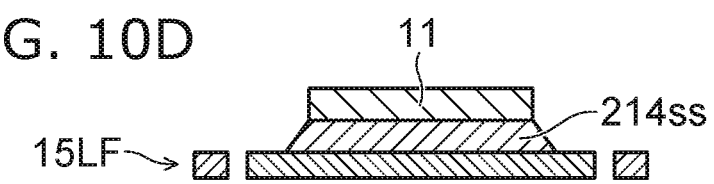

As shown in FIG. 10C, after the semiconductor chip 11 is placed on the joining member 214ss1, as shown in FIG. 10D, the sintering treatment for decreasing the thermal resistance is performed, and the joining member 214ss having the improved thermal conductivity is obtained. The sintering treatment is a long time high temperature curing treatment, for example, it is performed at approximately 250° C. and for 90 minutes in the case of the Ag paste.

Figure 10E:
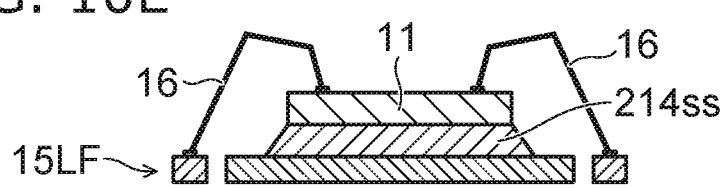
Figure 10F:
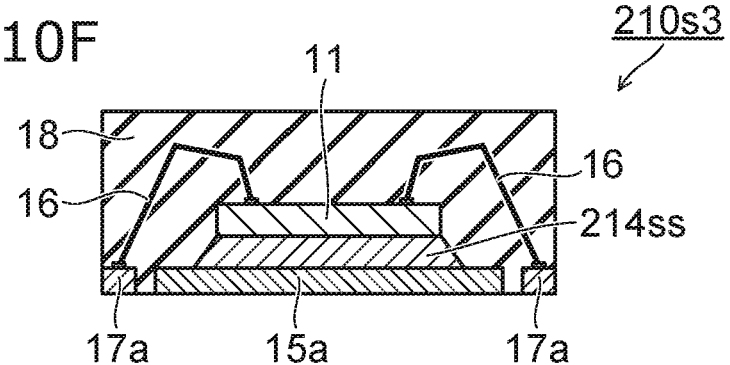

As shown in FIG. 10E, the semiconductor chip 11 and the portion serving as the connection terminal are connected by the bonding wire 16, and as shown in FIG. 10F, the resin is filled by the transfer mold or the like, and the lead frame 15LF is cut.

In this way, in the case of the comparative example, since the sintering treatment of the Ag paste is added for decreasing the thermal resistance, the number of the main processes is six. The high temperature heat treatment is required for the sintering treatment of the Ag paste, and throughput of the manufacturing decreases.

On the contrary, in the embodiment and its variation, the number of the main processes can be reduced to 5 by using the joining member 214 made of the metal fiber sheet. Because of the decrease of the thermal resistance, the manufacturing process can be more shortened than the case of the comparative example which requires 6 processes or 7 processes.

In the semiconductor device of the embodiment and the variation, the joining member 214 is formed of the metal fiber sheet. For that reason, the decrease of the thermal resistance can be easily realized by the high thermal conductivity of the metal fiber. A desired value of the thermal resistance can also be easily realized by setting adequately the area and the thickness of the joining member 214.

Since the metal fiber of the joining member 214 does not include Pb, the semiconductor devices 210, 210a can be Pb free.

The joining member 214 includes a thermosetting resin. Since the thermosetting resin has low temperature curing characteristics, the semiconductor chip 11 and the die pad 15a can be connected by the short time heat treatment. Therefore, the thermal stress in manufacturing the semiconductor device can be reduced and the environmental resistance can be improved.

Third Embodiment

The metal fiber sheet impregnated with the thermosetting resin can also be used as the die pad or the connection terminal by forming into a lead frame configuration.

Figure 11A:
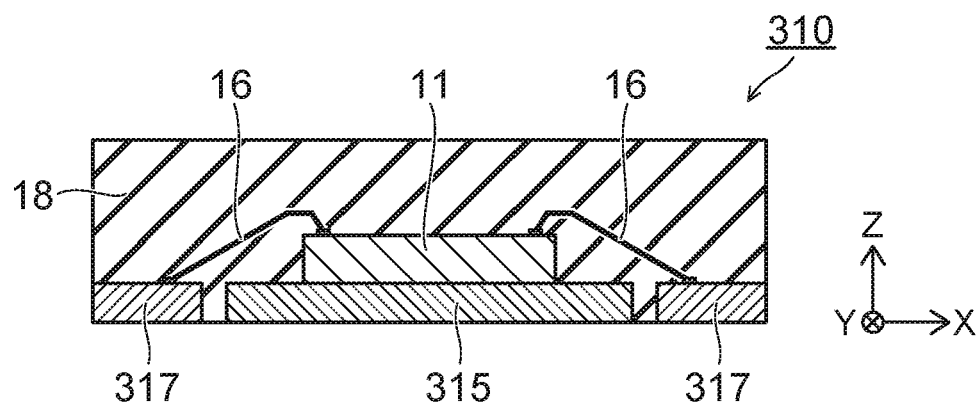
FIG. 11A is a cross section view of a semiconductor device according to a third embodiment at the position corresponding to AA line of FIG. 1A.
Figure 11B:
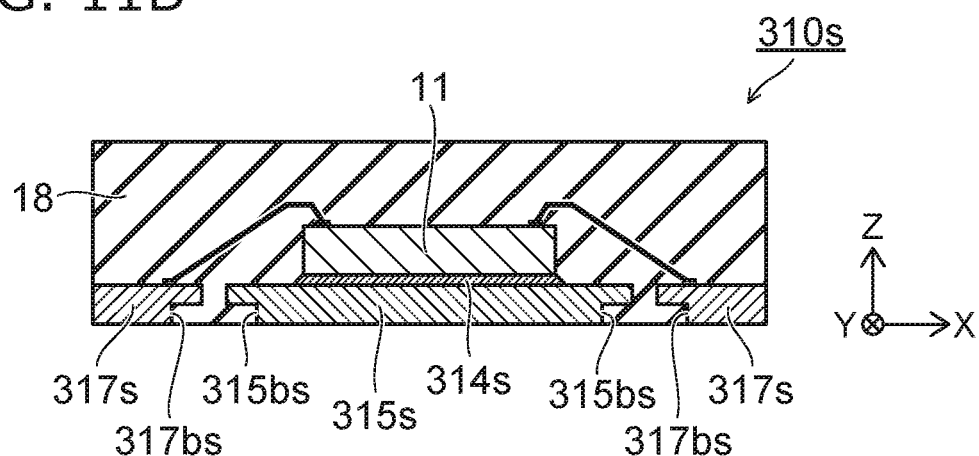
FIG. 11B is a cross sectional view of the semiconductor device of a comparative example at the position corresponding to AA line of FIG. 1A.

FIG. 11A is a cross sectional view of a semiconductor device according to the embodiment at the position corresponding to AA line of FIG. 1A. FIG. 11B is a cross sectional view of a semiconductor device of a comparative example at the position corresponding to AA line of FIG. 1A.

As shown in FIG. 11A, a semiconductor device 310 includes the semiconductor chip 11 and a die pad 315. The semiconductor chip 11 is connected onto the die pad 315. The die pad 315 is formed by disconnecting the lead frame cut from the metal sheet impregnated with the thermosetting resin with a connection terminal 317.

The die pad 315 includes the metal fiber, and thus has low thermal resistance. A desired low thermal resistance value can be realized by adjusting a thickness of the die pad 315.

The die pad 315 includes the thermosetting resin, and thus can be connected to the semiconductor chip 11 without use of the joining member and without the long time heat treatment. Since the metal fiber does not include Pb, the semiconductor device 310 can be Pb free.

Furthermore, the surfaces of the die pad 315 and the connection terminal 317 are substantially roughened by the metal fiber, and adhesion with the sealing resin 18 can be improved. The adhesion of the die pad 317 and the connection terminal 317 with the sealing resin 18 is improved, and thus it is difficult for troubles such as peeling to be caused by thermal stress or the like during mounting to the device, and the environmental resistance can be improved.

As shown in FIG. 11B, in the semiconductor device 310 of the comparative example, the semiconductor chip 11 is connected onto a die pad 315s including Cu via the joining member 314s, for example. In the case where the joining member 314s is the Ag paste or the like, the thermal resistance is low and the heat dissipation performance of the semiconductor device 310s is low. Although the thermal resistance can be improved by changing the Ag paste to solder or the like, it may be difficult to make Pb free.

In the semiconductor device 310s of the comparative example, the die pad 315s and the connection terminal 317s have notches 315bs, 317bs. The notches 315bs, 317bs are provided across the respective perimeters on a lower surface side of the die pad 315s and the connection terminal 317s, namely, on a side of a surface opposite to the surface where the semiconductor chip 11 is mounted. When the sealing resin is filled, the sealing resin 18 wraps around the notches 315bs, 317bs, and thus the adhesion of the die pad 315s and the connection terminal 317s with the sealing resin 18 is improved. The improvement of the adhesion of the die pad 315s and the connection terminal 317s with the sealing resin 18 prevents the die pad 315s and the connection terminal 317s from dropping off from the sealing resin 18.

However, since the notches 315bs, 317bs like this are formed by etching the lead frame, it takes a processing time and becomes a factor of increasing the cost.

In the semiconductor device 310 of the embodiment, since the die pad 315 and the connection terminal 317 are formed of the metal fiber sheet, surfaces of the die pad 315 and the connection terminal 317 are substantially roughened by the metal fiber, and the adhesion with the sealing resin is improved. Therefore, the semiconductor device 310 having high adhesion with the sealing resin can be realized without subjecting the metal fiber sheet to special processing.

The die pad 315 can be connected to the semiconductor chip 11 by the thermosetting resin impregnated with the metal fiber without via the joining member. Therefore, the manufacturing process of the semiconductor device 310 can be more simplified than the case of the comparative example.

(Variation)

Figure 12A:
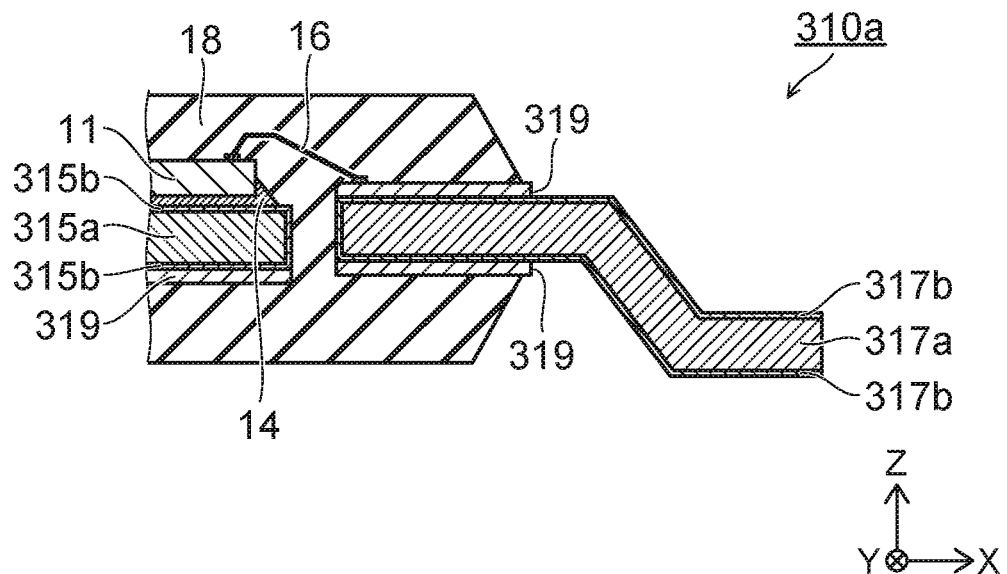
FIG. 12A is a partial cross sectional view of a semiconductor device according to variation of the third embodiment.
Figure 12B:
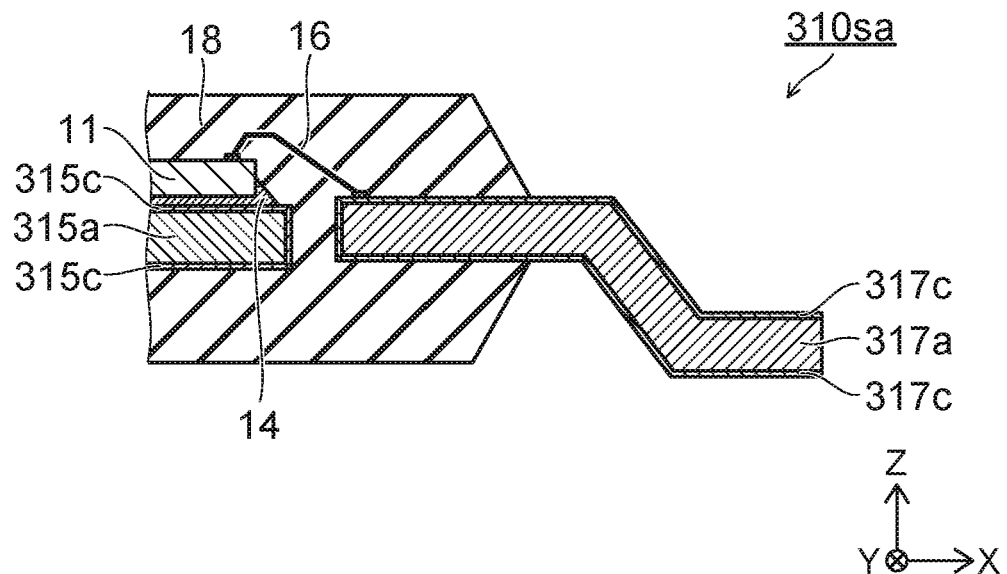
FIG. 12B is a partial cross sectional view of a semiconductor device of a comparative example at the position corresponding to AA line of FIG. 1A.

FIG. 12A is a partial cross sectional view of a semiconductor device according to the variation at the position corresponding to AA line of FIG. 1A. FIG. 12B is a cross sectional view of a semiconductor device of a comparative example at the position corresponding to AA line of FIG. 1A.

In this variation, the metal fiber sheet impregnated with the thermosetting resin is provided in portions of the die pad and the connection terminal.

As shown in FIG. 12A, a semiconductor device 310a of the variation includes a die pad 315a, a connection terminal 317a, and the sealing resin 18. Plated layers 315b, 317b are provided on surfaces of the die pad 315a and the connection terminal 317a, respectively. A metal fiber layer 319 is provided between the plated layer 315b of the die pad 315a and the sealing resin 18. The metal fiber layer 319 is provided also between the plated layer 317b of the die pad 315a and the sealing resin 18. The metal fiber layer 319 is a layer of the metal fiber sheet impregnated with the thermosetting resin.

In the variation, in order to obtain sufficient adhesion of the sealing resin 18 with the die pad 315a including the plated layer 315b and the connection terminal 317a including the plated layer 317b, the metal fiber layer 319 is provided in these connection portions. The metal fiber layer 319 is not provided in an exposed portion of the connection terminal 317a for connecting an external circuit.

The plated layers 317b of nickel (Ni), palladium (Pd) and gold (Au) are stacked in this order on the portion exposed to the outside of the connection terminal 317a from the surface side of the base material, for example. The highly stable plated layers 315b, 317b are formed, and thus a connection state with high reliability can be realized even if in the external environment including solder flux or the like.

The metal fiber layer 319 is selectively affixed to the connection portion to the sealing resin in advance on the surfaces of the die pad 315a and the connection terminal 317a, for example. The metal fiber layer 319 is not affixed to the portion exposed to the outside of the connection terminal 317a, and the metal plated layer of Au or the like is exposed.

As shown in FIG. 12B, in a semiconductor device 310sa of the comparative example, for example, multilayered plating of Ni, Pd, Au is formed in the initial stage on the whole surface of the die pad 315a and the connection terminal 317a, however the portion connected to the sealing resin 18 is roughened until the approximately Ni layer in order to secure the adhesion with the sealing resin. For that reason, it results in formation of the roughened plated layers 315c, 317c on the surfaces of the die pad 315a and the connection terminal 317a. Although the adhesion is ensured by the roughened plated layers 315c and 317c in the connection portion to the sealing resin 18, the plated layer 317c of the exposed surface of the connection terminal 317a is also roughened, and thus degradation of connection strength and solder wettability or the like may occur by long-term exposure to the external environment.

In the variation, by selectively providing the metal fiber layer 319, the die pad 315a and the connection terminal 317a can maintain the plated layer 317b for external connection while securing the adhesion with the sealing resin 18.

For that reason, the die pad 315a and the connection terminal 317a do not peel off from the sealing resin 18 due to the thermal stress in substrate mounting or the like for connecting to the external circuit, and the environmental resistance can be improved. The heat conduction to the sealing resin 18 is improved by enlarging the connection area of the sealing resin with the die pad 315a and the connection terminal 317a, and the heat conduction improvement is expected to contribute to the improvement of the thermal resistance.

The highly stable plated layer 317b is exposed to the surface of the connection terminal 317a exposed to the outside, and the connection terminal 317a can be connected to a connection land or the like formed on the substrate of the external circuit by the plater layer 317b with high reliability.

Fourth Embodiment

If the metal fiber sheet is affixed to an externally exposed electrode of a semiconductor device, the thermal resistance during substrate mounting can be reduced.

Figure 13A:
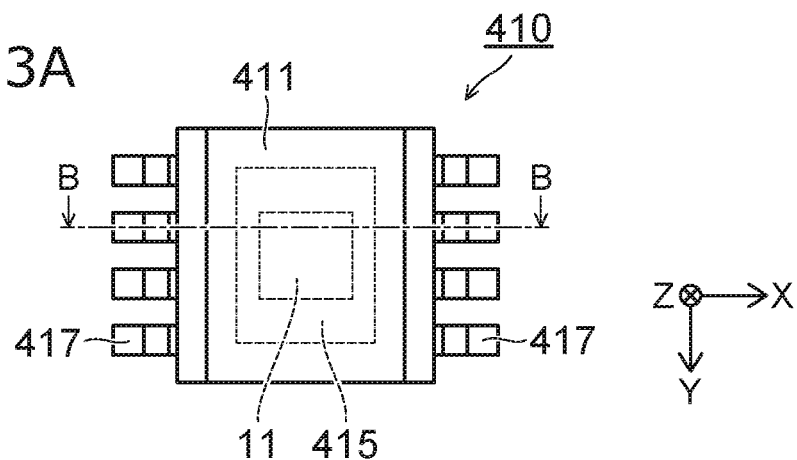
FIG. 13A is a bottom view illustrating a semiconductor device according to a fourth embodiment.
Figure 13B:
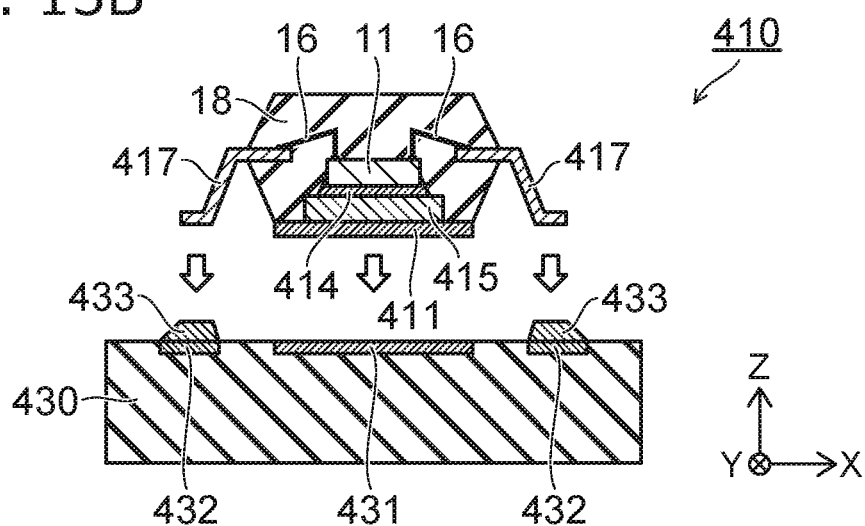
FIG. 13B is a cross sectional view at BB line of FIG. 13A.
Figure 13C:
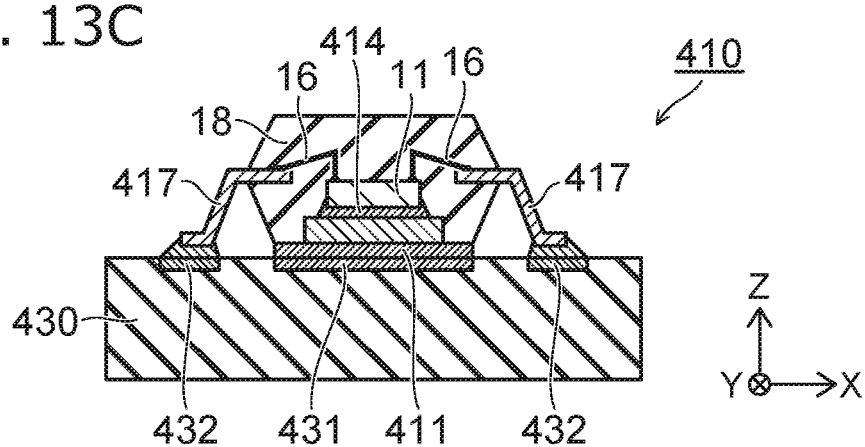
FIG. 13C is a cross sectional view at BB line of FIG. 13A.

FIG. 13A is a bottom view illustrating a semiconductor device according to the embodiment. FIG. 13B and FIG. 13C are cross sectional views at BB line of FIG. 13A.

FIG. 13B and FIG. 13C show a substrate 430 mounting a semiconductor device 410 together with the semiconductor device 410.

As shown in FIG. 13A to FIG. 13C, an additional exposed electrode 411 is provided on the bottom surface of the semiconductor device 410. The additional exposed electrode (heat dissipation member) 411 is affixed to an exposed surface of an exposed electrode 415 serving as the die pad. The additional exposed electrode 411 is provided so that the perimeter surrounds the perimeter of the exposed electrode 415. The area of the addition exposed electrode 411 is set to be larger than the area parallel to the X-Y plane of the exposed electrode 415.

The semiconductor chip 11 is provided on the exposed electrode 415 via a joining member 414. The joining member 414 may be, for example, either solder or the metal fiber sheet.

The semiconductor device 410 can be connected to the external circuit by an interconnection pattern 432 drawn on the substrate 430. The substrate 430 is a PCB (Printed Circuit Board), and a heat dissipation pattern 431 is provided on the substrate 430 other than the interconnection pattern 432. The heat dissipation pattern 431 has a larger area than the interconnection pattern 432. The heat dissipation pattern 431 may be connected to one or more of the interconnection patterns 432 on any position of the substrate 430.

The substrate 430 is formed of an insulating material such as, for example, polyimide-based resin, glass epoxy, various ceramics or the like. The heat dissipation pattern 431 and the interconnection pattern 432 are good conductors such as Cu or the like, which are formed by etching or the like on the substrate 430 or in the substrate 430.

The heat dissipation pattern of this example is provided to fit a perimeter shape and the area of the additional exposed electrode 411. The land is provided on the interconnection pattern 432, and a spare solder 433 is made on the land.

The additional exposed electrode 411 is directly connected to the heat dissipation pattern 431 of the semiconductor device 410, and is connected to the connection terminal 417.

Effects of the semiconductor device of the embodiment will be described while comparing with to semiconductor device of a comparative example.

Figure 14A:
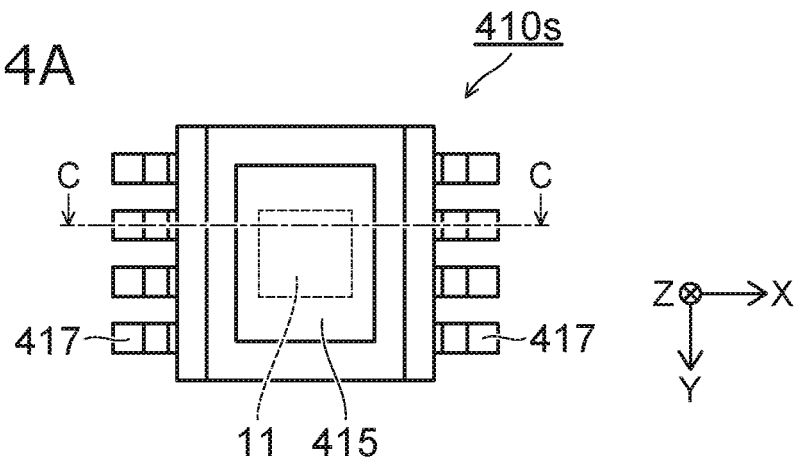
FIG. 14A is a bottom view illustrating a semiconductor device of a comparative example.
Figure 14B:
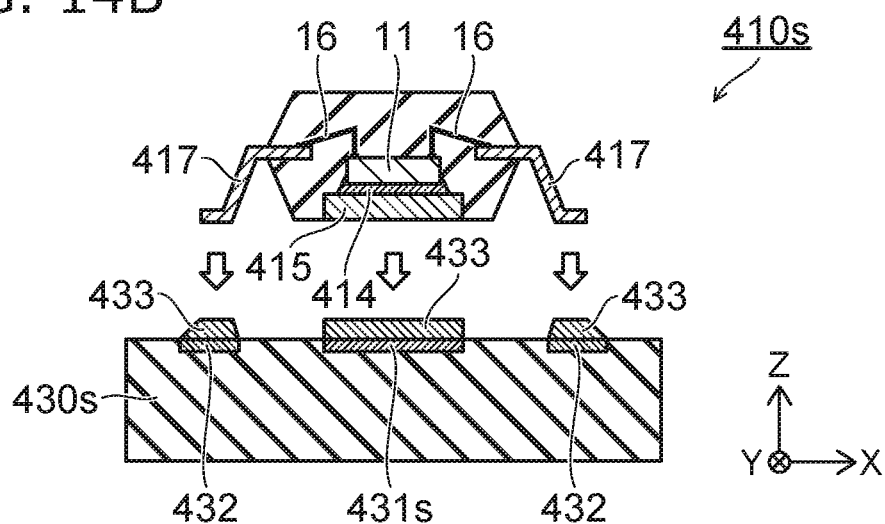
FIG. 14B is a cross sectional view at CC line of FIG. 14A.
Figure 14C:
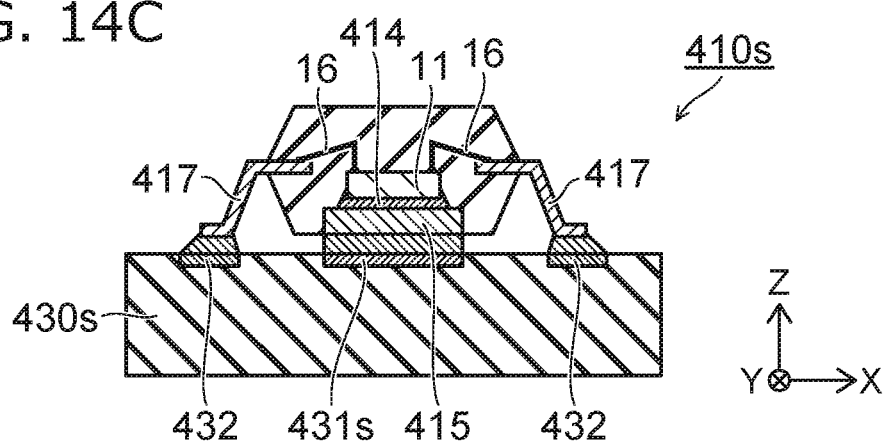
FIG. 14C is a cross sectional view at CC line of FIG. 14A.

FIG. 14A is a bottom view illustrating the semiconductor device of the comparative example. FIG. 14B and FIG. 14C are cross sectional views at CC line of FIG. 14A.

As shown in FIG. 14A to FIG. 14C, a semiconductor device 410s of the comparative example includes the exposed electrode 415 which is exposed to the outside. The semiconductor chip 11 is provided on the exposed electrode 415 via the joining member 414.

A heat dissipation pattern 431s and the interconnection pattern 432 are provided on a substrate 430s. The spare solder 433 is made on both the heat dissipation pattern 431s and the interconnection pattern 432.

The exposed electrode 415 and the connection terminal 417 of the semiconductor device 410s are connected to the heat dissipation pattern 431s and the interconnection pattern 432, respectively via the solder 433. The solder 433 can spreads a bit depending on the wettability, however is difficult to spread so as to broaden the heat dissipation path sufficiently. Therefore, since an area of the heat dissipation pattern 431s cannot be broadened sufficiently more than an area of the exposed electrode 415, improvement of heat dissipation due to enlargement of the heat dissipation pattern 431s is not said to be sufficient in the semiconductor device 410 of the comparative example.

On the contrary, in the case of the embodiment, the additional electrode 411 is provided between the exposed electrode 415 and the heat dissipation pattern 431, and the perimeter shape and the area of the additional exposed electrode 411 can be sufficiently larger than the exposed electrode 415. Since the additional exposed electrode 411 is made of the metal fiber sheet and has high thermal conductivity, the low thermal resistance can be realized in the semiconductor device 410 mounted on the substrate 430. Therefore, in the case where the semiconductor device 410 is mounted on the substrate 430, the perimeter shape and the area of the heat dissipation pattern 431 can be larger than the exposed electrode 415, and the heat dissipation performance of the semiconductor device 410 during mounting can be improved.

(Variation)

FIG. 15A is a front view illustrating a semiconductor device according to the variation. FIG. 15B is a side view illustrating the semiconductor device according to the variation.

The semiconductor device including the exposed electrode can be applied to a package of insert type such as SIP (Single Inline Package) and ZIP (Zigzag Inline Package) or the like without limitation to a surface mounting package.

As shown in FIG. 15A and FIG. 15B, a semiconductor device 410a includes a main body 410a1 and an additional heat dissipation fin 411a. The additional heat dissipation fin 411a is affixed to a heat dissipation fin 415a serving as the die pad. The perimeter of the additional heat dissipation fin 411a includes the perimeter of the heat dissipation fin 415a, and an area of the additional heat dissipation fin 411a is larger than an area of the heat dissipation fin 415a. The additional heat dissipation fin 411a is provided between the heat dissipation fin 415a and an wall surface 440a of a housing 440 when mounting the main body.

The additional heat dissipation fin (heat dissipation member) 411a is made of the metal fiber sheet. The additional heat dissipation fin 411a is connected to the heat dissipation fin 415a of the main body 410a1 by the thermosetting resin of the metal fiber sheet.

The semiconductor device 410a is connected to the wall surface 440a by the thermosetting resin of the additional heat dissipation fin 411a. In order to increase the connection strength at oscillation, the semiconductor device 410a may be tightened and fixed by a bolt and a nut or the like piercing, for example, the main body 410a1, the additional heat dissipation fin 411a and the housing 440.

A connection terminal 417a of the semiconductor device 410a is inserted into the land hole of the substrate 430, and is soldered.

The additional heat dissipation fin itself may be used as the wall surface of the housing 440.

In this way, even in the case of a self-contained mounting type semiconductor device, the thermal resistance of the semiconductor device 410a can be reduced and the heat dissipation performance can be improved by providing the additional heat dissipation fin 411a between the heat dissipation fin 415a of the main body and the wall surface 440a.

In the case where screw rock of the semiconductor device 410a to the wall surface 440a can be omitted, the semiconductor device 410a can be easily attached to the housing 440 by heating the thermosetting resin of the additional heat dissipation fin 411a.

Fifth Embodiment

Figure 16A:
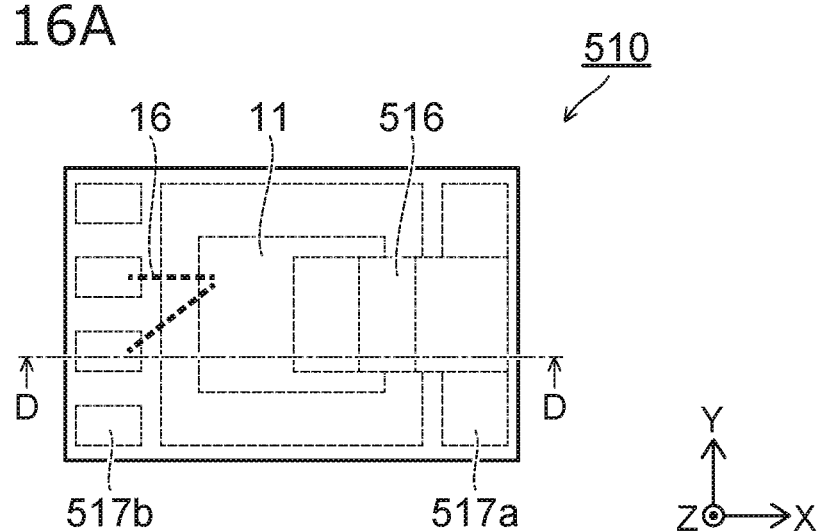
FIG. 16A is a plan view illustrating a semiconductor device according to a fifth embodiment.
Figure 16B:
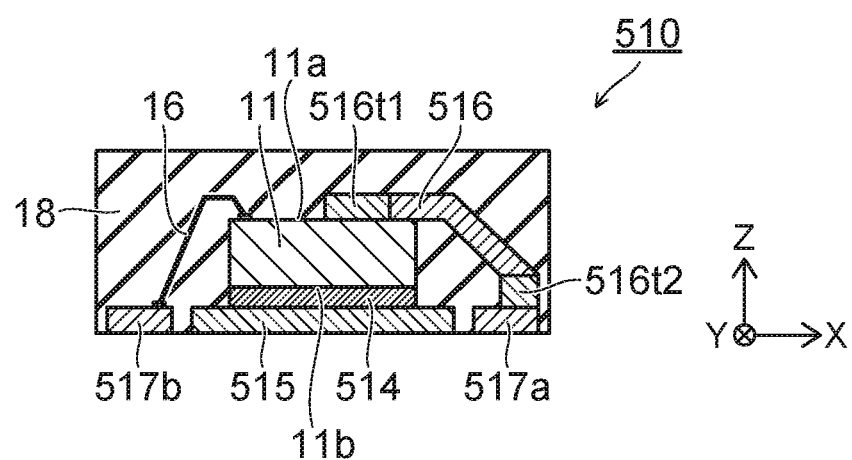
FIG. 16B is a cross sectional view at DD line of FIG. 16A.

FIG. 16A is a plan view illustrating a semiconductor device according to a fifth embodiment. FIG. 16B is a cross sectional view at DD line of FIG. 16A.

As shown in FIG. 16A and FIG. 16B, a semiconductor device 510 of the embodiment includes the semiconductor chip 11 and an interconnection member 516. The semiconductor device 510 further includes a die pad 515 and connection terminals 517a, 517b.

The interconnection member 516 is made of the metal fiber sheet impregnated with the thermosetting resin. One end 516t1 of the interconnection member 516 is connected to the connection pad of the semiconductor chip 11. The interconnection member 516 is bent in the negative direction of the Z-axis between the one end 516t1 and other end 516t2. The other end 516t2 of the interconnection member 516 is connected to the connection terminal 517a. Lower surfaces of the die pad 515 and the connection terminals 517 are included in the same plane. The semiconductor chip 11 is connected to the die pad 515 on an opposite surface (second surface 11b) of the first surface 11a via a joining member 514. The joining member 514 is made of the metal fiber sheet impregnated with the thermosetting resin.

Other connection pad of the semiconductor chip 11 is electrically connected to the connection terminal 517b via the bonding wire 16.

The semiconductor chip 11 is a discrete element including a back side electrode such as, for example, MOFET (Metal-Oxide-Semiconductor Field-Effect Transistor). When the semiconductor chip 11 is MOSFET, the die pad 515 is a drain electrode, and the connection terminal 517a is a source terminal, and the connection terminal 517b is a gate terminal.

Since the interconnection member 516 of the semiconductor device 510 of the embodiment includes the thermosetting resin, heat crimp can be made at a low temperature without requiring a high temperature solder joining process for connection of the semiconductor chip 11 and the connection terminal 517a.

Since the interconnection member 516 includes the metal fiber, high conductivity can be realized and low loss of the semiconductor device 510 is possible.

Since the surface of the interconnection member 516 is substantially roughened by the metal fiber, the environmental resistance and the heat dissipation performance can be improved by improvement of the adhesion with the sealing resin 18.

Since the joining member 514 made of the metal fiber sheet is also used for connection of the semiconductor chip 11 and the die pad 515, package assembling is possible at a low temperature. For that reason, the manufacturing line can be simplified in the semiconductor device 510.

Since solder and Pb are not used in manufacturing the semiconductor device 510, Pb free can be made easily.

(Variation)

Figure 17A:
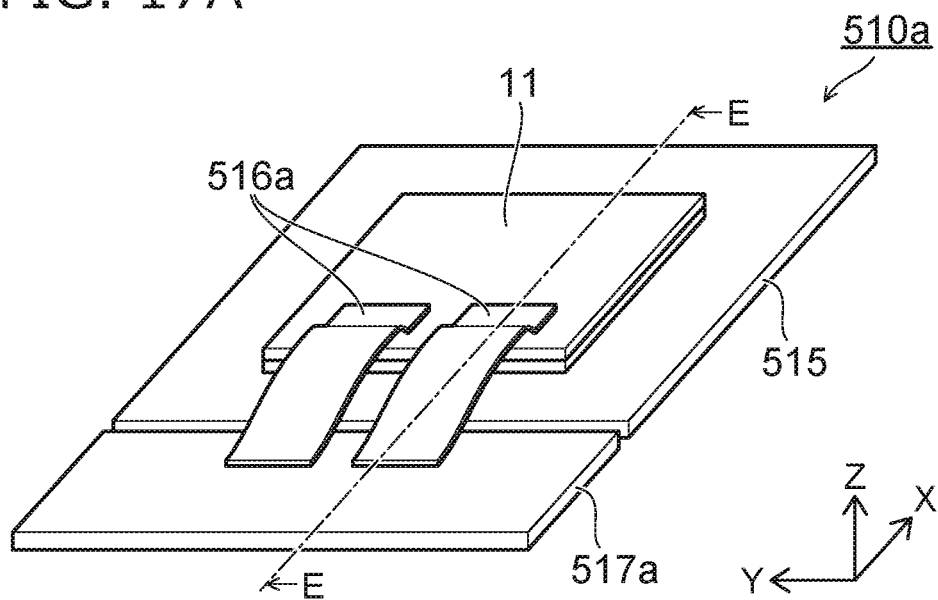
FIG. 17A is a perspective view illustrating a semiconductor device according to a variation of the fifth embodiment.
Figure 17B:
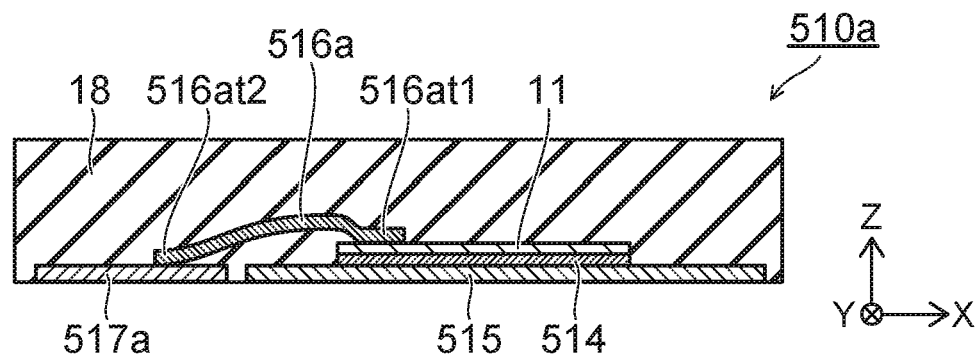
FIG. 17B is a cross sectional view at EE line of FIG. 17A.

FIG. 17A is a perspective view illustrating a semiconductor device according to the variation. FIG. 17B is a cross sectional view at EE line of FIG. 17A.

FIG. 17A schematically show by abstracting the portion of the sealing resin.

As shown in FIG. 17A and FIG. 17B, the multiple interconnection members 516 are used in parallel in a semiconductor device 510a of the variation. The semiconductor chip 11 is connected to the die pad 515 by the joining member 514. The joining member 514 is, for example, the solder and the metal fiber sheet. Each interconnection member 526a is connected to the connection pad on the semiconductor chip 11 at one end 516at1 and connected to the connection terminal 517a at other end 516at2.

The interconnection member 516a is made of the metal fiber sheet impregnated with the thermosetting resin. A direct current resistance value between the semiconductor chip 11 and the connection terminal 517a can be reduced by the multiple interconnection members 516a. For that reason, an outputting current of the semiconductor device 510a is increased, and a power loss can be reduced.

Since the interconnection member 516a includes the thermosetting resin as well as the case of the other embodiments described above, the semiconductor chip 11 and the connection terminal 517a can be connected at a low temperature heat treatment. For that reason, the thermal stress in the manufacturing can be reduced and the environmental resistance of the semiconductor device 510a can be improved.

(Variation 2)

Figure 18A:
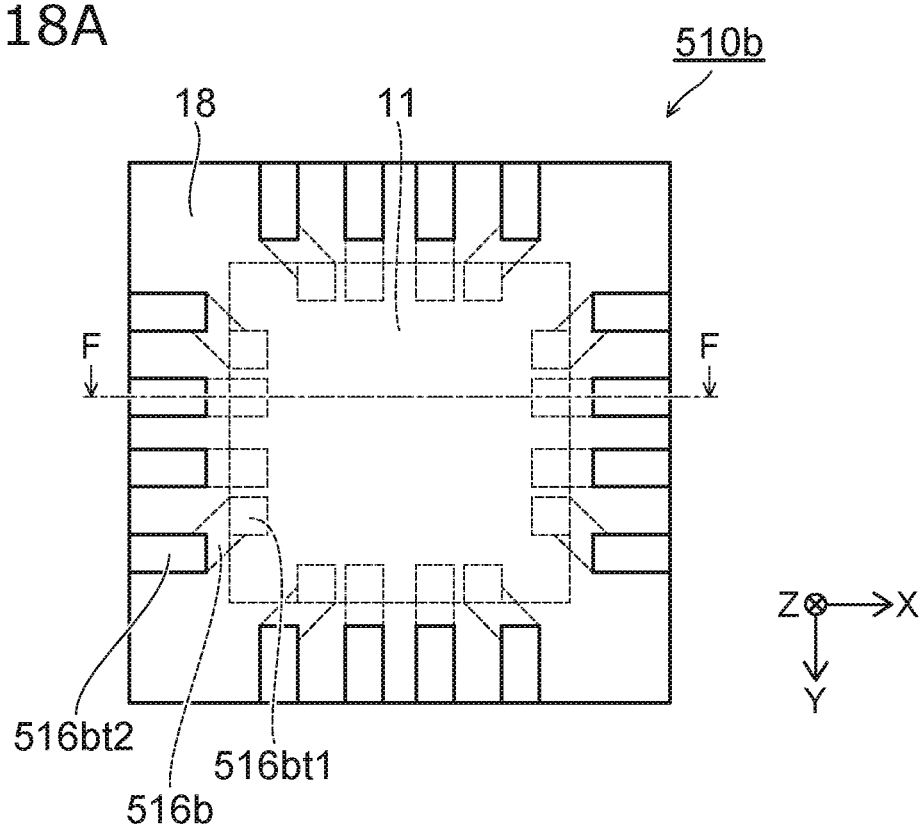
FIG. 18A is a bottom view illustrating a semiconductor device according to a variation of the fifth embodiment.
Figure 18B:
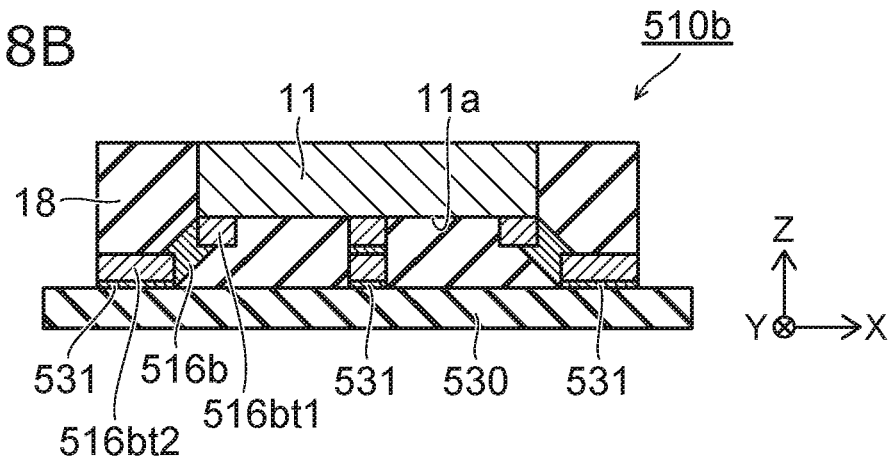
FIG. 18B is a cross sectional view at FF line of FIG. 18A.

FIG. 18A is a bottom view illustrating a semiconductor device according to the variation. FIG. 18B is a cross sectional view at FF line of FIG. 18A.

FIG. 18B also shows a substrate 530 on which a semiconductor device 510b is mounted.

As shown in FIG. 18a and FIG. 18B, the semiconductor device 510b of the variation includes the semiconductor chip 11 and multiple interconnection members 516b. The first surface 11a of the interconnection members 516b are directed downward, namely, to the negative direction of the Z-axis. The interconnection members 516b are connected to the first surface 11a at one end 516bt1. As described later, other end 516bt2 functions as the connection terminal to the external circuit. The number of the interconnection members 516b is favorable to be multiple not less than 3, for example. The interconnection members 516b may be provided to surround the perimeter portion of the first surface 11a like this example.

The interconnection members 516b are connected to the connection pad on the first surface 11a at the one end 516bt1 and are bent toward the negative direction of the Z-axis between the one end 516bt1 and the other end 516bt2. Bottom surfaces of the other ends 516bt2 of the all interconnection members 516b are included in the same plane parallel to the XY plane.

The interconnection members 516b are made of the metal fiber sheet impregnated with the thermosetting resin. The one end 516bt1 is connected to the connection pad provided on the first surface 11a by the heat treatment.

The other end 516bt2 is connected by the heat treatment to the land of the interconnection pattern 531 provided on the substrate 530 for connecting to the external circuit.

The semiconductor device 510b of the embodiment includes multiple number s of interconnection members 516b made of the metal fiber sheet. The multiple number s of interconnection members 516b are connected to the semiconductor chip 11 at the one end 516bt1, and connected to the substrate at the other ends 516bt2. Therefore, the interconnection member 516 forms a heat dissipation path from the semiconductor chip 11, and the heat can be effectively dissipated to the substrate 530.

The interconnection member 516 can be easily connected to the semiconductor chip 11 and the substrate 530 at a low temperature by the thermosetting resin, and the thermal stress during manufacturing the semiconductor device 510 can be reduced.

Roughening by the metal fiber of the interconnection members 516b is realized, and the adhesion with the sealing resin is improved. Since the other ends 516t2 of the interconnection members 516b can be mounted on the substrate by the low temperature heat treatment, the thermal stress during the substrate mounting can be reduced, resin peeling or the like can be prevented and the environmental resistance can be improved.

According to the embodiments described above, a semiconductor device including a package having improved heat dissipation performance and a method for manufacturing the semiconductor device can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first semiconductor chip;
a heat dissipation member provided on one surface of the first semiconductor chip and connected to the first semiconductor chip;
a sealing resin sealing the first semiconductor chip and the heat dissipation member,
the heat dissipation member including mutually interlaced metal fibers and a thermosetting resin, the heat dissipation member having a first surface facing the semiconductor chip and a second surface opposite the first surface, a whole of the second surface of the heat dissipation member being in contact with the sealing resin; and
a spacer securing a distance between the first semiconductor chip and the heat dissipation member, the spacer including a second semiconductor chip different from the first semiconductor chip, wherein the heat dissipation member is provided on a first surface, the first surface being connected to a bonding wire, the first surface being one of two surfaces of the first semiconductor chip.

2. The device according to claim 1 wherein in a plan view parallel to the first surface, a perimeter of the heat dissipation member includes a perimeter of the semiconductor chip.

3. The device according to claim 1, wherein the metal fiber includes copper or a copper alloy.

4. The device according to claim 1, wherein the thermosetting resin includes a thermosetting adhesive.

5. A semiconductor device, comprising:
a first semiconductor chip;
a heat dissipation member provided on one surface of the first semiconductor chip and connected to the first semiconductor chip;
a sealing resin sealing the first semiconductor chip and the heat dissipation member,
the heat dissipation member including mutually interlaced metal fibers and a thermosetting resin, the heat dissipation member having a first surface facing the semiconductor chip and a second surface opposite the first surface, a whole of the second surface of the heat dissipation member being in contact with the sealing resin; and
a spacer securing a distance between the first semiconductor chip and the heat dissipation member, the spacer including the metal fiber and the thermosetting resin, wherein
the heat dissipation member is provided on a first surface, the first surface being connected to a bonding wire, the first surface being one of two surfaces of the first semiconductor chip.

6. The device according to claim 5 wherein in a plan view parallel to the first surface, a perimeter of the heat dissipation member includes a perimeter of the semiconductor chip.

7. The device according to claim 5, wherein the metal fiber includes copper or a copper alloy.

8. The device according to claim 5, wherein the thermosetting resin includes a thermosetting adhesive.

* * * * *